United States Patent
Moon

(10) Patent No.: US 7,838,176 B2
(45) Date of Patent: Nov. 23, 2010

(54) PHOTO MASK AND METHOD FOR FABRICATING THE SAME

(75) Inventor: Jae In Moon, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 450 days.

(21) Appl. No.: 11/760,816

(22) Filed: Jun. 11, 2007

(65) Prior Publication Data
US 2008/0081266 A1    Apr. 3, 2008

(30) Foreign Application Priority Data
Sep. 29, 2006  (KR)  ............ 10-2006-0095708

(51) Int. Cl.
*G03F 1/00* (2006.01)
(52) U.S. Cl. .................................................. 430/5
(58) Field of Classification Search .......... 430/5; 716/19–21
See application file for complete search history.

(56) References Cited

U.S. PATENT DOCUMENTS

| | | | |
|---|---|---|---|
| 5,789,120 A * | 8/1998 | Jang et al. | 430/5 |
| 6,841,315 B2 * | 1/2005 | Imura | 430/5 |
| 6,884,551 B2 * | 4/2005 | Fritze et al. | 430/5 |
| 7,147,975 B2 * | 12/2006 | Misaka | 430/5 |
| 2004/0265708 A1 | 12/2004 | Misaka | |
| 2006/0269851 A1 | 11/2006 | Frisa et al. | |

FOREIGN PATENT DOCUMENTS

| | | |
|---|---|---|
| KR | 10-2003-0077446 | 10/2003 |
| KR | 10-2006-0076344 | 7/2006 |

* cited by examiner

*Primary Examiner*—Mark F Huff
*Assistant Examiner*—Jonathan Jelsma
(74) *Attorney, Agent, or Firm*—Marshall, Gerstein & Borun LLP

(57) ABSTRACT

A photo mask and the method for fabricating the same wherein the photo mask includes: a mask substrate; a frame pattern formed along a contour of a target pattern to be transcribed to a wafer on the mask substrate, which includes a first pattern arranged in the aperture orientation of an illuminating system and a second pattern arranged perpendicularly to the aperture orientation of the illuminating system; and a third pattern disposed in a inner region of the frame pattern, which has the same transmittance as the second pattern.

16 Claims, 6 Drawing Sheets

PHOTO MASK AND METHOD FOR FABRICATING THE SAME

CROSS-REFERENCE TO RELATED APPLICATION

The priority of Korean patent application number 10-2006-95708, filed on Sep. 29, 2006, which is incorporated by reference in its entirety, is claimed.

BACKGROUND OF THE INVENTION

The invention relates to a semiconductor device and, more particularly to a photo mask that can improve exposure resolution by controlling the transmittance of the photo mask, and to a method for fabricating the same.

In general, a semiconductor memory device, for example a dynamic random access memory (DRAM) device is made of numerous fine patterns, and such fine patterns are formed by a photo lithography process. In the photo lithography process a photoresist film is coated on a target film to be patterned, and exposure and development processes are carried out to form a photoresist film pattern that exposes a partial surface of the target film. Then, an etching process is carried out using this photoresist film pattern as a mask to remove the exposed portion of the target film. Subsequently, tile photoresist film pattern is stripped to form patterns.

Meanwhile, with the decrease in the design rules for devices to be highly integrated, an asymmetric illuminating system, such as a dipole illuminating system is used instead of using a symmetric illuminating system to improve the critical dimension (CD) uniformity and process margin of the patterns. Especially, the dipole illuminating system improves the process margin by carrying out higher resolution exposure to the pattern in the cell region.

FIG. 1 is a diagram illustrating a dipole illuminating system.

Referring to FIG. 1, the exposure process using the dipole illuminating system is carried out to improve resolution of patterns to be formed in the cell region via two apertures formed on the illuminating system. Here, the apertures formed on the illuminating system are formed in the X-axis direction or the Y-axis direction. However, when the exposure process is carried out using the asymmetric illuminating system, the light passed through the asymmetric illuminating system has directionality based on the asymmetric shape of the illuminating system, thereby varying the process margin depending on the position of the patterns. Especially, since the dipole illuminating system has different resolution depending on the orientation of patterns to be exposed, it has a high resolution with respect to the patterns having the same orientation as the aperture of the illuminating system. On the contrary, the dipole illuminating system has a relatively degraded resolution compared with the symmetric illuminating system with respect to the patterns having orientation perpendicular to the apertures of the illuminating system.

In fact, the patterns having orientation perpendicular to the dipole illuminating system may generate defects such as collapsing or bridging of patterns after carrying out the exposure process. Furthermore, in the layers using the dipole illuminating system, the size of the pattern layout design varies depending on the orientation of the illuminating system. Therefore, a method for improving resolution and stability with respect to the patterns having orientation perpendicular to the illuminating system is demanded.

BRIEF SUMMARY OF THE INVENTION

The invention provides a photo mask that can improve exposure resolution by controlling the transmittance of the photo mask using a photo mask pattern, and a method for fabricating the photo mask.

In accordance with one aspect, the invention provides a photo mask including: a mask substrate; a frame pattern formed along a contour of a target pattern to be transcribed to a wafer on the mask substrate, which includes a first pattern arranged in the aperture orientation of an illuminating system and a second pattern arranged perpendicularly to the aperture orientation of the illuminating system; and a third pattern disposed in an inner region of the frame pattern, which has the same transmittance as the second pattern.

The frame pattern is preferably in a line-shape pattern or in a dotted line-shape pattern.

The frame pattern is preferably formed as a light blocking region.

It is preferable that the first pattern has a transmittance of 1% to 3% and the second or third pattern has a transmittance not exceeding 6%.

It is preferable that the mask substrate has a transmittance of 100% and a phase difference of 0° and the first to third patterns have a phase difference of 180° with respect to the mask substrate.

In accordance with another aspect, the invention provides a method for fabricating a photo mask including: defining a layout of a target pattern to be transcribed to a wafer; forming a frame pattern along a contour of the target pattern layout; dividing the frame pattern into a first pattern arranged in an aperture orientation of an illuminating system and a second pattern arranged perpendicularly to the aperture orientation of the illuminating system; disposing a third pattern having the same transmittance as the second patter in an inner region of the frame pattern; and forming a layout of the frame pattern and third pattern on a mask substrate.

The step of forming the frame pattern may preferably include: defining a reduced layout which reduces inwardly from the target pattern layout with a desired width; and defining the frame pattern to have the contours of the target pattern layout and the reduced layout as a contour.

It is preferable that the frame pattern is in a line-shape pattern or in a dotted line-shape pattern.

The frame pattern is preferably formed as a light blocking region.

The first to third patterns are preferably formed as light blocking regions.

The first pattern may have a transmittance of 1% to 3% and the second or third pattern may have a transmittance not exceeding 6%.

It is preferable that the first to third patterns have a phase difference of 180° with respect to the mask substrate and the mask substrate has a transmittance of 100% and a phase difference of 0°.

BRIEF DESCRIPTION OF THE DRAWINGS

The above and other aspects, features and other advantages of the invention will be more clearly understood from the following detailed description taken in conjunction with the accompanying drawings, in which.

DETAILED DESCRIPTION OF THE INVENTION

Figure 1:
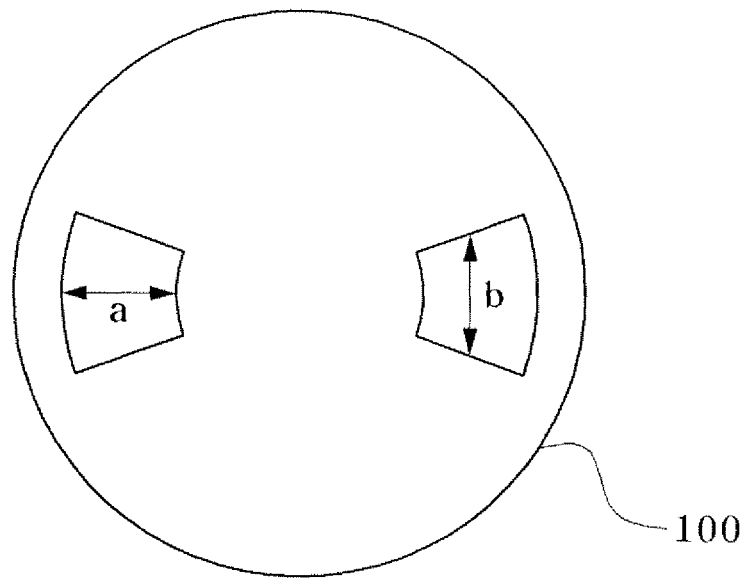
FIG. 1 is a diagram illustrating a dipole illuminating system.

Preferred embodiments of the invention are described below in detail with reference to the accompanying drawings. However, various variations and modifications can be made in the embodiments and the invention is not to be construed as limited to the following embodiments. The thickness has been magnified to clearly illustrate a plurality of layers and regions in the drawing. The same numerical symbols have been given to the similar parts throughout the specification.

Figure 2:
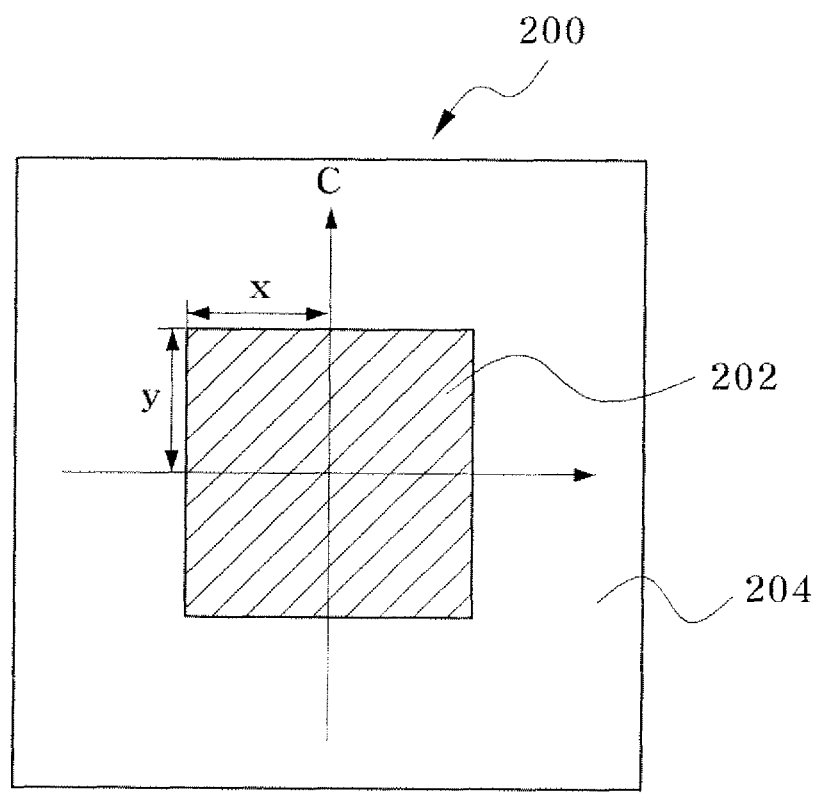
FIG. 2 is a diagram illustrating a half-tone phase shift mask.
Figure 3:
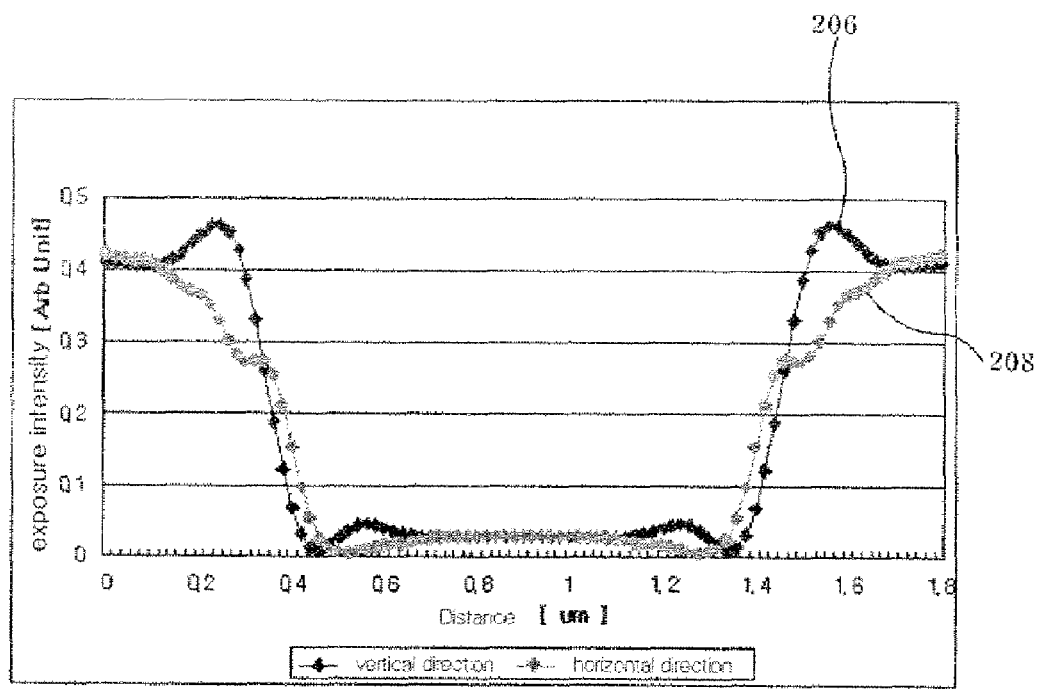
FIG. 3 is a diagram illustrating the light distribution graph of the half-tone phase shift mask in FIG. 2.
Figure 4:
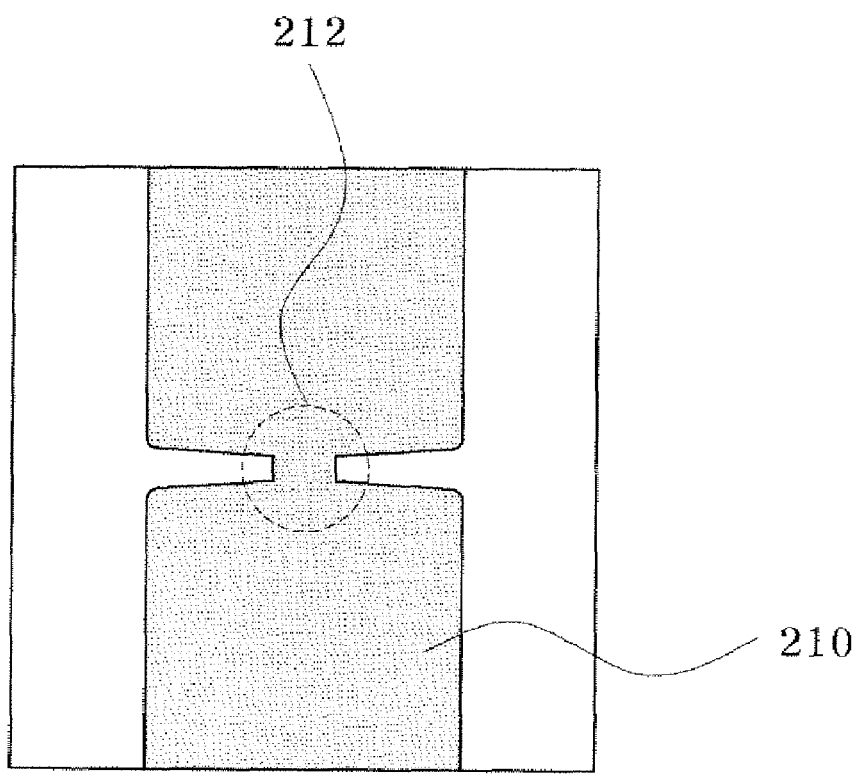
FIG. 4 is a diagram illustrating the problems generated when using the half-tone phase shift mask in FIG. 2.

FIG. 2 is a diagram illustrating a half-tone phase shift mask. FIG. 3 is a diagram illustrating the light distribution graph of the half-tone phase shift mask in FIG. 2. Further, FIG. 4 is a diagram illustrating the problems generated when using the half-tone phase shift mask in FIG. 2.

The half-tone phase shift mask is generally used as a photo mask in the process of carrying out the photo lithography process. Referring to FIG. 2, a half-tone phase shift mask 200 disposes a patterned portion 202 and an unpatterned portion 204 on a transparent substrate (not shown). The patterned portion 202 has the same size vertically and horizontally based on a central axis C. Here, the portion without a pattern, i.e., an unpatterned portion 204 has a transmittance of 100% and a phase difference of 0°. The portion with the pattern on the transparent substrate has a transmittance of 6% and a phase difference of 180° with respect to the transparent substrate. When exposing the half-tone phase shift mask 200 as a photo mask using a dipole illuminating system (see FIG. 1), even with the same sized pattern the exposure distribution may be exhibited differently depending on the orientation of the pattern, for example the orientation of the pattern with respect to the apertures of the illuminating system.

In the case of carrying out the exposure process using the half-tone phase shift mask and the dipole illuminating system, when the light distribution graph was examined on the vertical (X-axis direction) and horizontal (Y-axis direction) light distribution, it is confirmed that the light distribution is exhibited differently depending on the orientation of the illuminating system, for example a vertical direction 206 and a horizontal direction 208 of the illuminating system even with the same sized pattern, as shown in FIG. 3. Due to such difference, the resolution after carrying out the actual exposure process is reduced with respect to the orientation of dipole illuminating system. Thus, as shown in FIG. 4, problems such as a bridge phenomenon 212 that connects adjacent patterns 210 may be generated.

Therefore, the invention seeks to improve exposure resolution without being affected by the orientation of the apertures of the illuminating system by dividing the pattern for each exposure orientation when forming a pattern to be transcribed to a wafer on the photo mask.

Figure 5:
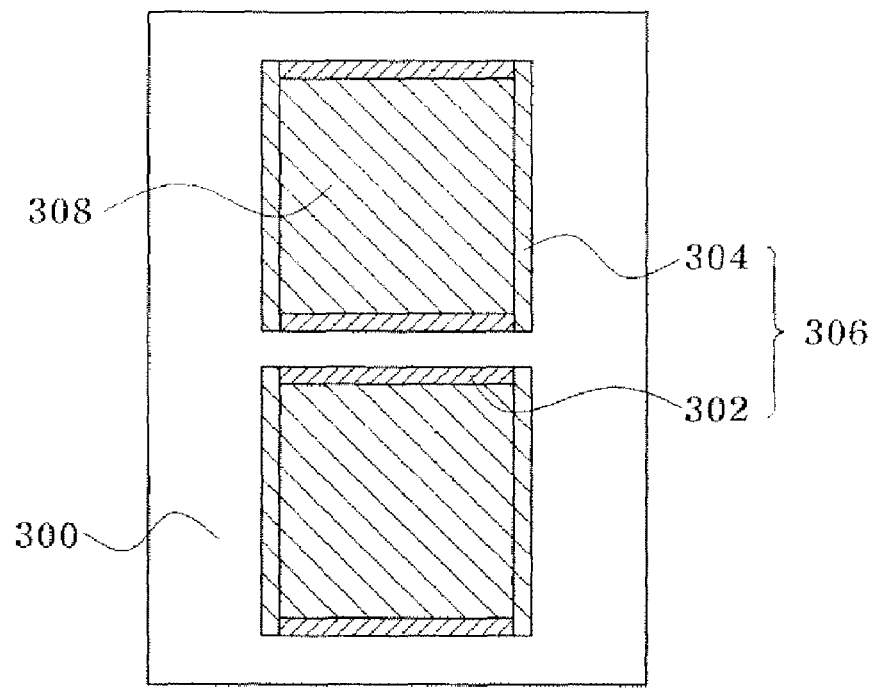
FIG. 5 is a diagram illustrating a photo mask according to the invention.

FIG. 5 is a diagram illustrating a photo mask according to the invention.

Referring, to FIG. 5, the photo mask according to the invention is formed including a mask substrate 300, frame patterns 306 formed along a contour of a target pattern to be transcribed to a wafer on the mask substrate 300, which target pattern includes first patterns 302 arranged in an aperture orientation of an illuminating system and second patterns 304 arranged perpendicularly to the aperture orientation of the illuminating system, and third patterns 308 disposed in an inner region of the frame patterns 306, which has the same transmittance as the second patterns 304. The mask substrate 300 is made of a transparent insulating material such as glass or quartz, and has a transmittance of 100% and a phase difference of 0°. Here, the frame patterns 306 may be in a line or dotted line-shape pattern and may be formed as a light blocking region. At this time, the first patterns 302 preferably have a transmittance of 1% to 3% and a phase difference of 180° with respect to the mask substrate 300. Moreover, the second patterns 304 or third patterns 308 preferably have a transmittance not exceeding 6% and a phase difference of 180° with respect to the mask substrate 300.

A method for fabricating the photo mask of the present invention is described with reference to FIGS. 6A to 7.

FIGS. 6A to 6F are diagrams illustrating the method for fabricating the photo mask according to the invention. Further, FIG. 7 is a diagram illustrating simulation results depending on the transmittance of the photo mask according to the invention.

Figure 6A:
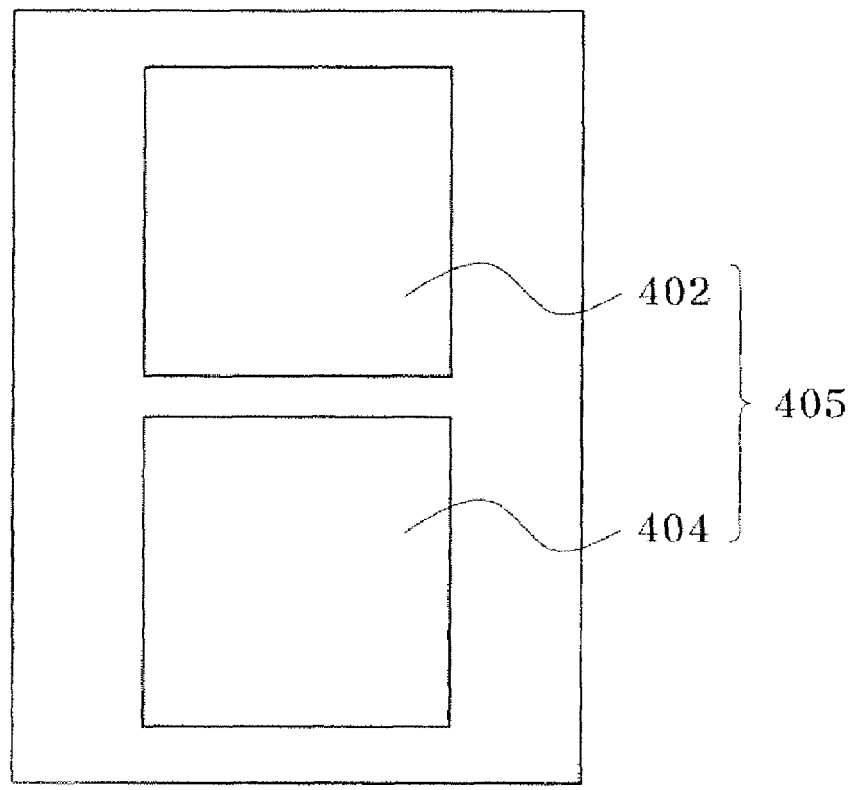
FIGS. 6A to 6F are diagrams illustrating a method for fabricating the photo mask according to the invention.

Referring to FIG. 6A, target pattern layouts to be transcribed to a wafer are defined. In an embodiment of the invention, a primary pattern 402 and a secondary pattern 404 are formed having the same size vertically and horizontally based on the central axis of the patterns. The secondary pattern 404, having the same size as the primary pattern 402, is arranged in a position spaced a predetermined distance from the primary pattern 402.

Accordingly, after defining the target pattern layouts to be transcribed to the wafer, frame patterns are formed along target pattern 405 layouts including the primary patterns 402 and the secondary patterns 404.

Figure 6B:
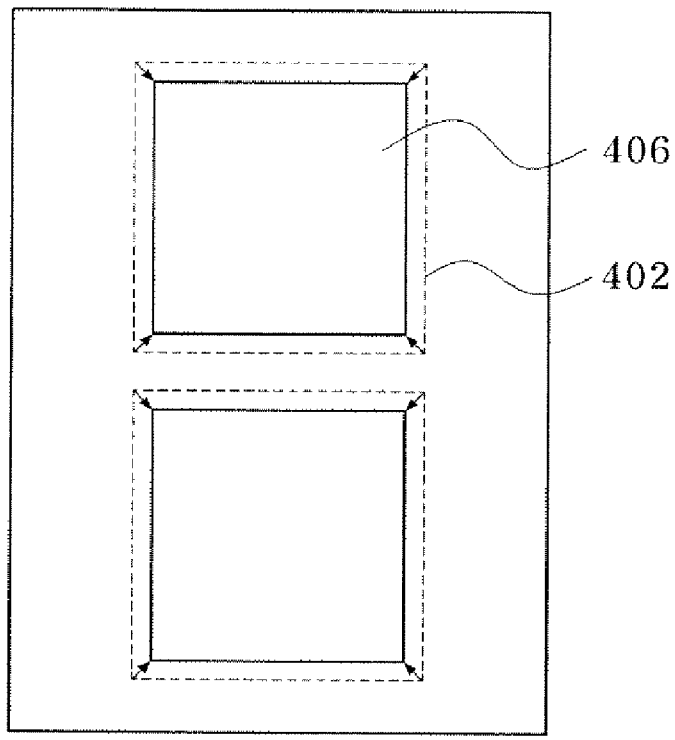
Figure 6C:
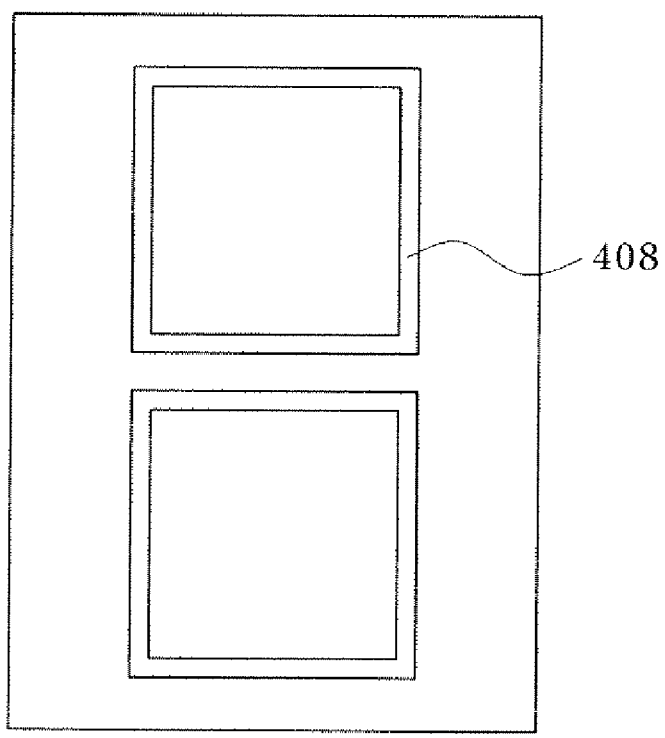

Referring to FIG. 6B, reduced layouts 406, which reduce inwardly from a contour of the target pattern 405 layouts with a certain width d, are defined. Next, the reduced layouts 406 reduced from the target patterns 405 are cut so that frame patterns 408 having contours of the target pattern 405 layouts and reduced layouts 406 as their contour are defined, as shown in FIG. 6C.

Figure 6D:
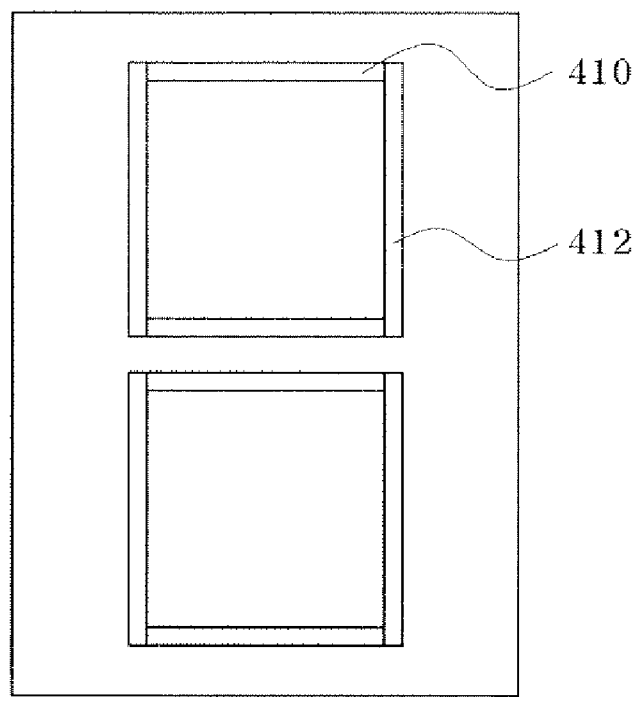

Referring to FIG. 6D, the frame patterns 408 are formed along the contour of the target patterns 405 and are divided into first patterns 410 arranged in the aperture orientation of the illuminating system and second patterns 412 arranged perpendicularly to the aperture orientation of the illuminating system.

Figure 6E:
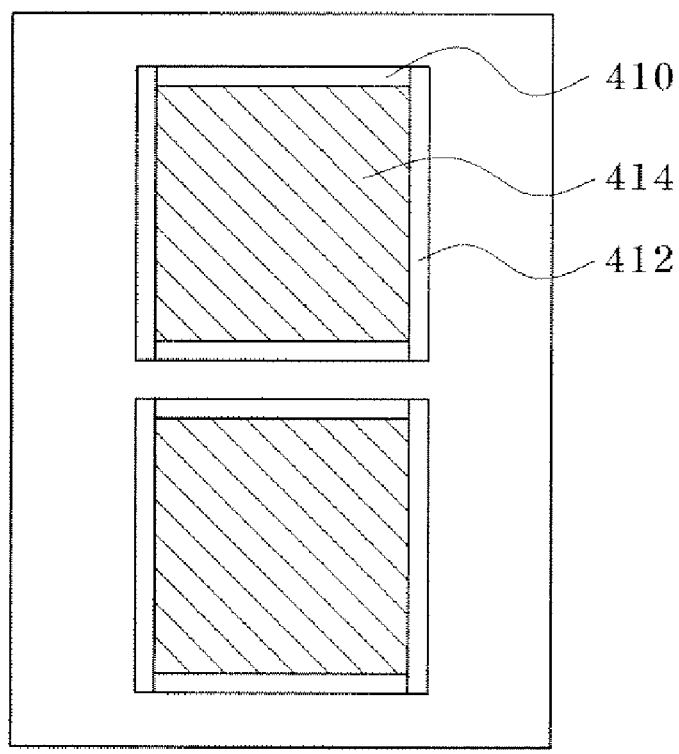

Referring to FIG. 6E, third patterns 414 having the same orientation as the second patterns 412, which are arranged perpendicularly to the aperture orientation of the illuminating system, are disposed in the inner region of the frame patterns 408.

Figure 6F:
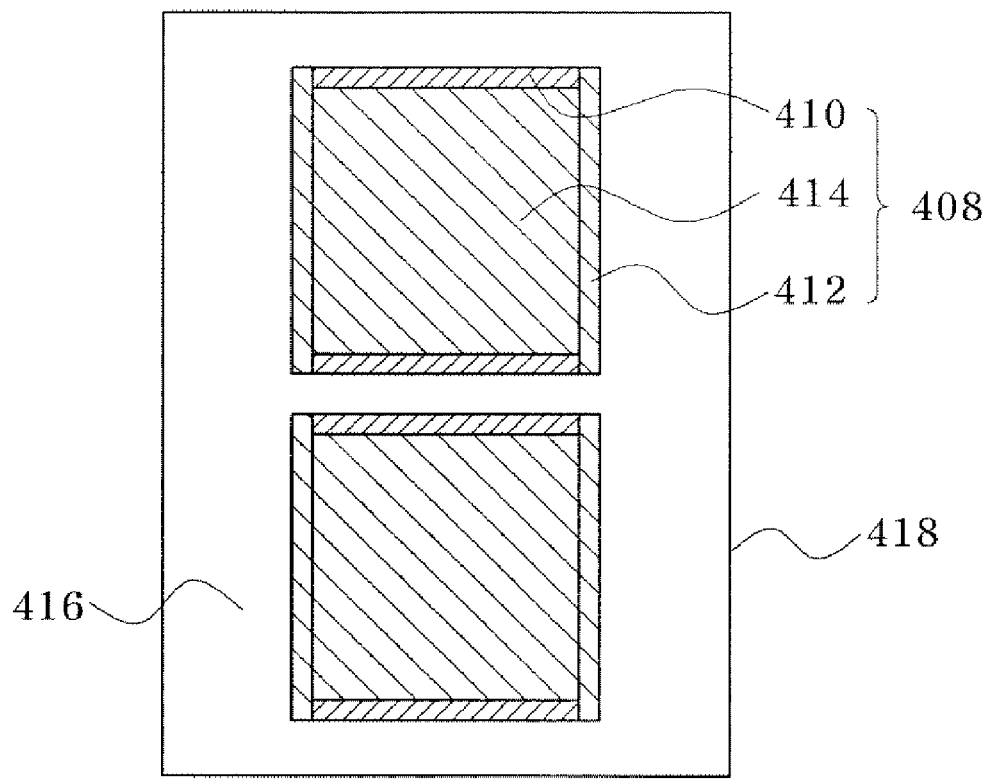

Referring to FIG. 6F, the photo mask 418 is formed by disposing on a mask substrate 416 the frame patterns 408 including the first patterns 410 arranged in the aperture orientation of the illuminating system and the second patterns 412 arranged perpendicularly to the illuminating system, and the third pattern 414 layouts filling the inner region of the frame patterns 408 and having the same transmittance as the second patterns 412.

Here, the mask substrate 416 is made of a transparent insulating material such as glass or quartz, and has the transmittance of 100% and the phase difference of 0°. The frame patterns 408 formed on the mask substrate 416 may be in a line-shape or in a dotted-line shape pattern, and may be formed as a light blocking region. At this time, it is preferable that the first patterns 410 have a transmittance of 1% to 3% and a phase difference of 180° with respect to the mask substrate 416. Moreover, the second patterns 412 or the third patterns 413 preferably have a transmittance not exceeding 6% and a phase difference of 180° with respect to the mask substrate 416.

Thus formed photo mask forms patterns differently depending on the aperture orientation of the illuminating system to control the transmittance according to the patterns. Thereby, the exposure amount may be controlled in the border of the patterns where light is transmitted according to the aperture orientation of the illuminating system in an exposure process to be carried out later. For example, the exposure amount may be controlled by forming the first patterns 410 arranged in the aperture orientation of the illuminating system to have a transmittance of 1% to 3% and a phase difference of 180° with respect to the mask substrate 416. Further, the exposure amount are preferably controlled by forming the second patterns 412 arranged perpendicularly to the illuminating system and the third patterns 414 filling the inside the frame to have a transmittance not exceeding 6% and a phase difference of 180° with respect to the mask substrate 416. As a result, collapsing the patterns or a bridging phenomenon between patterns by decrease in the resolution based on the orientation of the illuminating system can be prevented.

Figure 7:
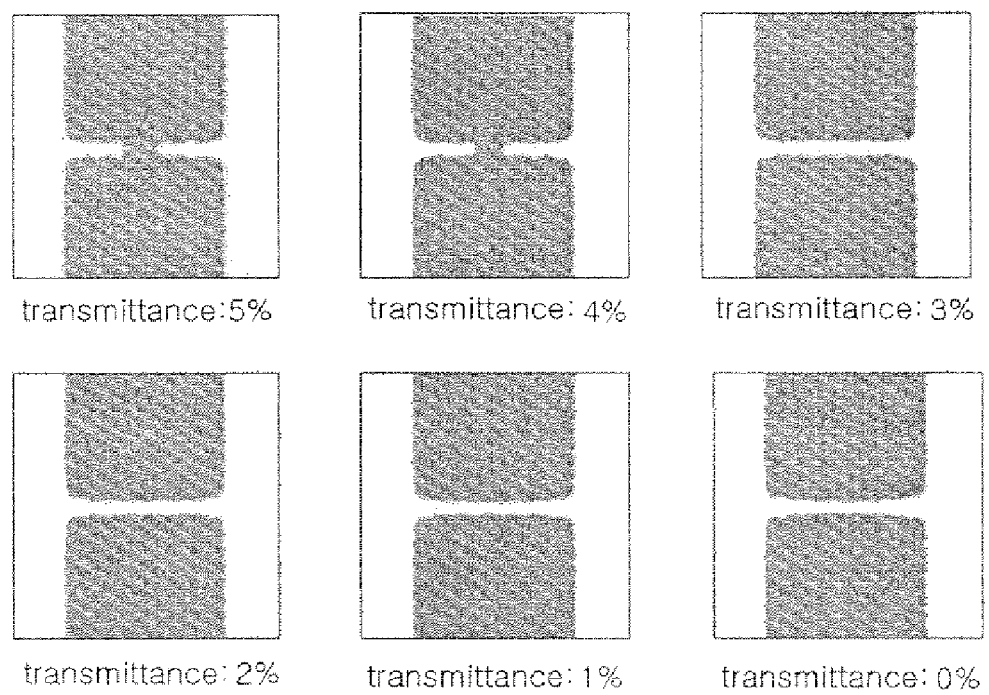
FIG. 7 is a diagram illustrating the simulation results depending on the transmittance of the photo mask according to the invention.

The simulation results measured when carrying out the exposure process using such photo mask and asymmetric illuminating system are provided in FIG. 7. At this time, a dipole illuminating system was used as an asymmetric illuminating system, and the simulation was performed by changing a transmittance to 0 to 5% in the aperture orientation part of the illuminating system. When performing the exposure process by controlling the transmittance to 0 to 5%, it is confirmed that the bridging phenomenon between patterns is eliminated with the transmittance of 3% or lower.

The photo mask and the method for fabricating the same according to the invention form patterns differently depending on the aperture orientation of an illuminating system. Furthermore, the transmittance, depending on the patterns formed differently is controlled such that the exposure amount at the boader of the patterns where light is transmitted according to the aperture orientation of the illuminating system can be controlled in the exposure process to be carried out later. By controlling the exposure amount at the border of the patterns where light is transmitted, a decrease in the resolution depending on the orientation of the illuminating system maybe prevented and the process margin may be ensured. Also, by forming the photo mask using the target pattern layout, any shape of exposure pattern may be realized, and the patterns can be stably formed.

The embodiments of the invention have been disclosed above for illustrative purposes. Those skilled in the art will appreciate that various modifications, additions and substitutions are possible, without departing from the scope and spirit of the invention as disclosed in the accompanying claims.

For example, in the embodiment of the invention, the method for fabricating the photo mask including patterns with the same size vertically and horizontally based on the central axis of the patterns has been illustrated. However, patterns with different sizes vertically and horizontally can be formed.

As described in the above, according to the photo mask and the method for fabricating the same of the invention, the exposure process resolution can be improved by controlling the transmittance depending on the illuminating system using each pattern as itself that exist on the mask.

What is claimed is:

1. A photo mask comprising:
a mask substrate;
a first main pattern to be transcribed to a wafer formed on the mask substrate; and
a second main pattern to be transcribed to the wafer formed on the mask substrate wherein the second main pattern is adjacent to the first main pattern and opposite sides between the first main pattern and the second main pattern respectively have the same transmittance;
wherein the first main pattern comprises a first frame pattern having a shape of a contour of the first main pattern and a third pattern filling an inner region of the first frame pattern, which first frame pattern includes a first pattern arranged in an aperture direction of an illuminating system and a second pattern arranged perpendicularly to the aperture direction of the illuminating system, wherein a transmittance of the first pattern is lower than a transmittance of the second pattern;
wherein the second main pattern comprises a second frame pattern having a shape of a contour of the second main pattern and a third pattern filling an inner region of the second frame pattern, which second frame pattern includes a first pattern disposed in the same direction as the first pattern of the first main pattern and a second pattern disposed in the same direction as the second pattern of the first main pattern.

2. The photo mask according to claim 1, wherein the first frame pattern or the second frame pattern is in a line-shape pattern.

3. The photo mask according to claim 1, wherein the first or second frame pattern is in a dotted line-shape pattern.

4. The photo mask according to claim 1, wherein the first or second frame pattern is formed as a light blocking region.

5. The photo mask according to claim 1, wherein the first pattern has a transmittance of 1% to 3% and the second or third pattern has a transmittance not exceeding 6%.

6. The photo mask according to claim 1, wherein the mask substrate has a transmittance of 100% and a phase difference of 0°.

7. The photo mask according to claim 1, wherein the first to third patterns have a phase difference of 180° with respect to the mask substrate.

8. A method for fabricating a photo mask comprising;
defining a layout of a first main pattern and a second main pattern to be transcribed to a wafer;
forming a first frame pattern of the first main pattern and a second frame pattern of the second main pattern formed out of a contour of the first and the second main pattern layout, wherein the second frame pattern is adjacent to the first frame pattern;
dividing each of the first and the second frame patterns into a first pattern arranged in an aperture direction of an illuminating system and a second pattern arranged perpendicularly to the aperture direction of the illuminating system, wherein a transmittance of the first pattern is lower than a transmittance of the second pattern and opposite sides between the first main pattern and the second main pattern respectively have the same transmittance;
filling an inner region of the first frame pattern and a second frame pattern by a third pattern, wherein the third pattern has the same transmittance as the second pattern; and forming a layout of the first frame pattern, the second frame pattern, and the third pattern on a mask substrate.

9. The method according to claim 8, wherein the step of forming the first and the second frame pattern comprises:
   defining a reduced layout that reduces in width inwardly from the first main pattern and a second main pattern layout with a desired width; and
   defining the first and the second frame pattern to have the contours of the first main pattern and a second main pattern layout and the reduced layout as a contour.

10. The method according to claim 8, wherein the first or the second frame pattern is in a line-shape pattern.

11. The method according to claim 8, wherein the first or the second frame pattern is in a dotted line-shape pattern.

12. The method according to claim 8, wherein the first or the second frame pattern is formed as a light blocking region.

13. The method according to claim 8, wherein the first to third patterns are formed as light blocking regions.

14. The method according to claim 8, wherein the first pattern has a transmittance of 1% to 3% and the second or third pattern has a transmittance not exceeding 6%.

15. The method according to claim 8, wherein the first to third patterns have a phase difference of 180° with respect to the mask substrate.

16. The method according to claim 8, wherein the mask substrate has a transmittance of 100% and a phase difference of 0°.

* * * * *